United States Patent
Mitchell et al.

(10) Patent No.: US 11,332,362 B2
(45) Date of Patent: May 17, 2022

(54) VIBRATION ISOLATOR PLATFORM WITH ELECTRONIC ACCELERATION COMPENSATION

(71) Applicant: Bliley Technologies, Inc., Erie, PA (US)

(72) Inventors: Jay Mitchell, Ann Arbor, MI (US); David Lemmerhirt, Ann Arbor, MI (US); Onnop Srivannavit, Ann Arbor, MI (US)

(73) Assignee: Bliley Technologies, Inc., Erie, PA (US)

( * ) Notice: Subject to any disclaimer, the term of this patent is extended or adjusted under 35 U.S.C. 154(b) by 463 days.

(21) Appl. No.: 16/279,030

(22) Filed: Feb. 19, 2019

(65) Prior Publication Data

US 2019/0256348 A1    Aug. 22, 2019

Related U.S. Application Data

(60) Provisional application No. 62/632,591, filed on Feb. 20, 2018.

(51) Int. Cl.
*B81B 7/00* (2006.01)
*B81B 3/00* (2006.01)
*H05K 1/02* (2006.01)

(52) U.S. Cl.
CPC .......... *B81B 7/0016* (2013.01); *B81B 3/0021* (2013.01); *B81B 7/0058* (2013.01);
(Continued)

(58) Field of Classification Search
CPC ... B81B 7/0016; B81B 3/0021; B81B 7/0058; B81B 2201/0235; H05K 1/0216; H05K 2201/2045
(Continued)

(56) References Cited

U.S. PATENT DOCUMENTS

| 4,100,512 A | * | 7/1978 | Valdois | ..................... H03B 5/32 |
| | | | | 331/158 |
| 4,991,446 A | * | 2/1991 | Bechtel | ..................... G01N 3/20 |
| | | | | 73/849 |

(Continued)

FOREIGN PATENT DOCUMENTS

| CN | 112818288 A | * | 5/2021 | |
| DE | 102009020838 A1 | * | 11/2009 | ............. G01C 19/56 |

(Continued)

OTHER PUBLICATIONS

Translation JP-06289046-A (Year: 1994).*
Translation JP-H06200978-A (Year: 1994).*
U.S. Appl. No. 14/251,972, filed Apr. 14, 2014.

*Primary Examiner* — Alexander A Mercado
*Assistant Examiner* — Monica S Young
(74) *Attorney, Agent, or Firm* — Dickinson Wright PLLC

(57) ABSTRACT

A system is provided for providing vibration isolation and acceleration compensation for a device such as a vibration-sensitive oscillator or sensor. The system has an assembly that moves or vibrates relative to an external component. The assembly includes a plurality of components mounted to either side of a PCB. One or more accelerometers are configured to detect acceleration of the PCB in at least one of an X-axis direction, a Y-axis direction, and a Z-axis direction. The system includes plurality of isolators coupled to the assembly and configured to isolate or dampen vibrations that would otherwise transfer to the assembly from an underlying component to which the assembly is configured to attach to. In certain embodiments, the isolators are located between the assembly and the underlying component within vertical confines of an exterior perimeter of the PCB.

11 Claims, 8 Drawing Sheets

(52) U.S. Cl.
CPC .... *H05K 1/0216* (2013.01); *B81B 2201/0235* (2013.01); *H05K 2201/2045* (2013.01)

(58) Field of Classification Search
USPC .......................................................... 73/514.1
See application file for complete search history.

(56) References Cited

U.S. PATENT DOCUMENTS

| | | | | |
|---|---|---|---|---|
| 5,811,821 | A * | 9/1998 | Alexander | G05D 19/02 |
| | | | | 248/550 |
| 5,948,981 | A * | 9/1999 | Woodruff | B81B 3/0081 |
| | | | | 73/514.29 |
| 6,662,655 | B2 * | 12/2003 | Foote | F16F 15/02 |
| | | | | 248/604 |
| 6,731,180 | B1 * | 5/2004 | Clark | H03L 1/04 |
| | | | | 310/341 |
| 7,106,143 | B2 * | 9/2006 | Bloch | H03B 5/04 |
| | | | | 331/158 |
| 8,049,326 | B2 | 11/2011 | Najafi et al. | |
| 8,698,292 | B2 | 4/2014 | Najafi et al. | |
| 10,988,375 | B1 * | 4/2021 | English | B81B 7/02 |
| 2002/0092352 | A1 * | 7/2002 | Foote | G01P 15/097 |
| | | | | 73/514.21 |
| 2003/0112086 | A1 * | 6/2003 | Tillotson | G04F 5/06 |
| | | | | 331/175 |
| 2005/0242893 | A1 * | 11/2005 | Bloch | H03B 5/36 |
| | | | | 331/158 |
| 2009/0282915 | A1 * | 11/2009 | Ohta | B81B 7/0058 |
| | | | | 73/504.12 |
| 2010/0079101 | A1 * | 4/2010 | Sidman | F16M 11/041 |
| | | | | 318/649 |
| 2011/0167912 | A1 * | 7/2011 | Ohta | G01P 15/125 |
| | | | | 73/504.12 |
| 2013/0194770 | A1 * | 8/2013 | Bernstein | B81B 7/0016 |
| | | | | 438/106 |
| 2014/0001687 | A1 * | 1/2014 | Braman | F16F 15/08 |
| | | | | 29/527.1 |
| 2017/0089943 | A1 * | 3/2017 | Chen | B81B 7/0048 |
| 2017/0167946 | A1 * | 6/2017 | Coronato | B81B 7/0041 |
| 2018/0230005 | A1 * | 8/2018 | Lee | B81B 7/0048 |

FOREIGN PATENT DOCUMENTS

| | | | | |
|---|---|---|---|---|
| EP | 2771591 B1 * | 12/2017 | | F16F 7/1005 |
| EP | 3434930 A1 * | 1/2019 | | F16F 15/027 |
| JP | H06200978 A * | 7/1994 | | |
| JP | H06289046 A * | 10/1994 | | |
| JP | 2000121369 A * | 4/2000 | | |
| JP | H06289046 A * | 5/2009 | | |
| RU | 2347969 C2 * | 2/2009 | | |
| WO | WO-2015103220 A1 * | 7/2015 | | G01P 1/003 |

* cited by examiner

US 11,332,362 B2

VIBRATION ISOLATOR PLATFORM WITH ELECTRONIC ACCELERATION COMPENSATION

CROSS-REFERENCE TO RELATED APPLICATIONS

This application claims the benefit of U.S. provisional application Ser. No. 62/632,591 filed Feb. 20, 2018, the disclosure of which is hereby incorporated in its entirety by reference herein.

TECHNICAL FIELD

This disclosure relates generally to the field of precision timing references, and more specifically to an improved system for mitigating adverse effects of vibration and acceleration on crystal or MEMS-based oscillators. This disclosure can also be applied to inertial sensors, magnetometers and other electronic components whose performance is degraded by vibration and acceleration.

BACKGROUND

Vibration is an important factor for frequency control and timing applications (e.g., in MEMS applications) because vibration causes significant phase noise, which reduces the bandwidth in communication systems, compromises slow speed detection in radar systems, and can significantly reduce the frequency stability in a range of other important applications. Current state of the art systems use two methods for dealing with this problem: i) a vibration compensation system using an accelerometer for closed loop compensation which is effective for low-frequency vibrations (0-200 Hz for example), and ii) a passive vibration isolator which filters higher frequency vibrations (>200 Hz for example). As illustrated in FIG. 1, these two methods can be combined in order to enable device with low vibration sensitivity to all outside vibration frequencies. It may be particularly desirable to compensate for vibration from 10 Hz to 2000 Hz since most vehicles (ground such as trucks, and aerial such as helicopters, drones or planes) impart vibration in those frequency bands. Furthermore, high performance devices such as quartz oscillators require ovens to precisely hold their temperature constant during operation. The combination of the oven and the vibration compensation/isolator make the entire system very large and expensive to implement.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Passive Vibration Isolators:

One approach to passive vibration isolation is to mount the oscillator in a fixture supported by rubber (or similar material) columns, grommets, or brackets or bumps affixed near the corners. For maximum efficacy, these members should be flexible in three dimensions, which enables attenuation of vibrations with vector components along any axis. The frequency response of the system, which acts as a spring-mass-damper system, should be designed to attenuate vibrations above a specified corner frequency. The natural frequency of the system is governed by the mass of the load (the oscillator and its fixture hardware) and the spring constant of the isolator mounts, which depends on their shape and material properties. Without damping, this is governed by Hooks law: F=m×A=k×d. F is the force which is determined by the mass (m) times the acceleration (A). This is equal to the spring force (k) times the displacement (d). The natural frequency ($F_N$) will then equal:

$$F_N = \frac{1}{2\pi}\sqrt{k/m}.$$

To avoid potentially damaging the spring or noise-inducing excessive motion at resonance, the material properties of the isolator mounts and/or the surrounding medium can be selected to induce damping (i.e. energy dissipation).

Figure 1:
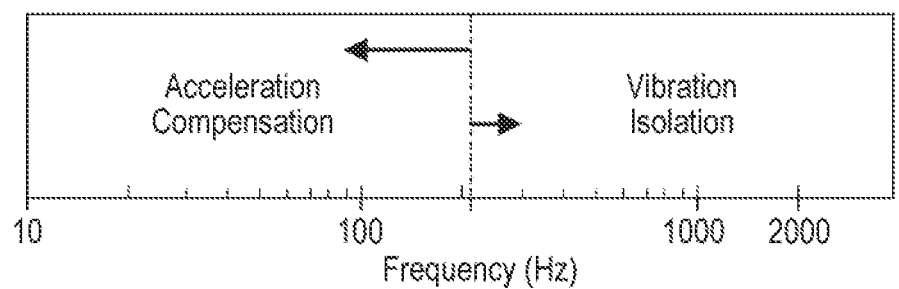
FIG. 1 is a comparative illustration of a combined system with a vibration or acceleration compensation system using an accelerometer for closed loop compensation which is effective for low-frequency vibrations (e.g., 0-200 Hz), and a passive vibration isolator which filters higher frequency vibrations (e.g., >200 Hz).
Figure 2:
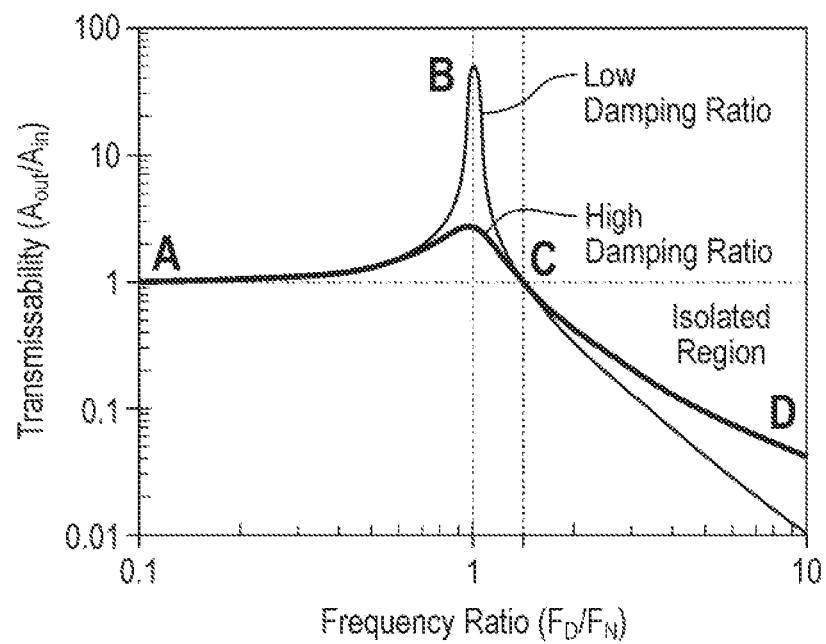
FIG. 2 is a graphical illustration of frequency responses of an isolated region designed for vibration filtering, according to one embodiment.

FIG. 2 shows the frequency response of such a system. In the figure, the ratio of the isolated system's frequency is $F_D$ and the natural frequency of the system is $F_N$. The ratio of $F_D/F_N$ is the "frequency ratio." The input vibration or acceleration amplitude is $A_{in}$ and the acceleration of the isolated system is $A_{out}$. The ratio between $A_{out}/A_{in}$ is called the transmissibility ratio. In FIG. 2, the transmissibility ratio is graphed verses the frequency ratio. As shown at point A, when the frequency ratio is significantly lower than 1 (i.e. the $F_D$ is much lower than the natural frequency, $F_N$), the transmissibility ratio is around 1 (i.e. the acceleration/vibration amplitude which the isolated system sees, $A_{out}$, is the same that input from outside, $A_{in}$). At point B, when the frequency ratio is 1 (i.e. $F_D$ equals the $F_N$), the transmissibility ratio is the highest. For systems with very little damping the frequency ratio can be more than 100 (which means the isolation system actually amplifies the amplitude of vibration by more than 100 times). As shown in the figure, low damping rubber will only amplify vibration by a factor of around 10, whereas high damping materials will only have a small amount of amplification. Point C shows the corner frequency where the frequency ratio is 3/2. At this point the transmissibility ratio is around 1. Above this frequency ratio, vibrations are attenuated (reduced) by approximately 20 dB per frequency decade. For example, if the natural frequency is 66.7 Hz, the corner frequency will be 66.7×(3/2)=100 Hz. Then at 1000 Hz, the amplitude of vibration will be reduced by approximately 20 dB (or a factor of 100). It is therefore desirable for some applications to design an isolation system with a very low natural frequency to cut off high frequency vibrations.

Achieving such a system raises several challenges, which justify the need for the present disclosure: i) large size due to incorporating four bulky mounts into a system which already contains large components such as the oscillator package and associated electronics, ii) high mass due to the need to properly load the vibration isolators, iii) high cost due to the necessity of using four specialized isolator mounts, which are typically expensive. These and other challenges inhibit the ability to produce vibration-isolated crystal oscillators compact enough to be incorporated into precise timing references for applications with form factor limitations (e.g. an ultra-precise timing reference for avionics or military ground vehicles that combines an oven-controlled crystal oscillator (OCXO) with another precision timing reference. It is especially difficult to design passive vibration isolators which can filter out low frequency vibrations while being small in size and robust to mechanical shock. This motivates the present disclosure.

Vibration Compensation:

Methods for active compensation for the acceleration sensitivity of crystal oscillators can employ a single-axis accelerometer or three orthogonal single-axis accelerometers to measure the mechanical vibration to which a crystal is subjected. The accelerometer output is used to provide a compensating signal directly to the crystal electrodes or to derive a signal for tuning the voltage-controlled oscillator. One example is disclosed in U.S. Pat. No. 4,453,141 which is hereby incorporated by reference in its entirety.

Using this method, there are now small low-cost accelerometers and even 3-axis accelerometers available that can be integrated into a small size system. The compensation circuit can be easily tuned in order to enable compensation at low frequencies. As higher frequencies, compensation becomes more difficult because it becomes harder and harder to match up the phase of the accelerometer measurement with that of the device being compensated. Typically, above 200 Hz vibration compensation becomes more difficult. This motivates the use of passive vibration isolators along with acceleration compensation.

Figure 3:
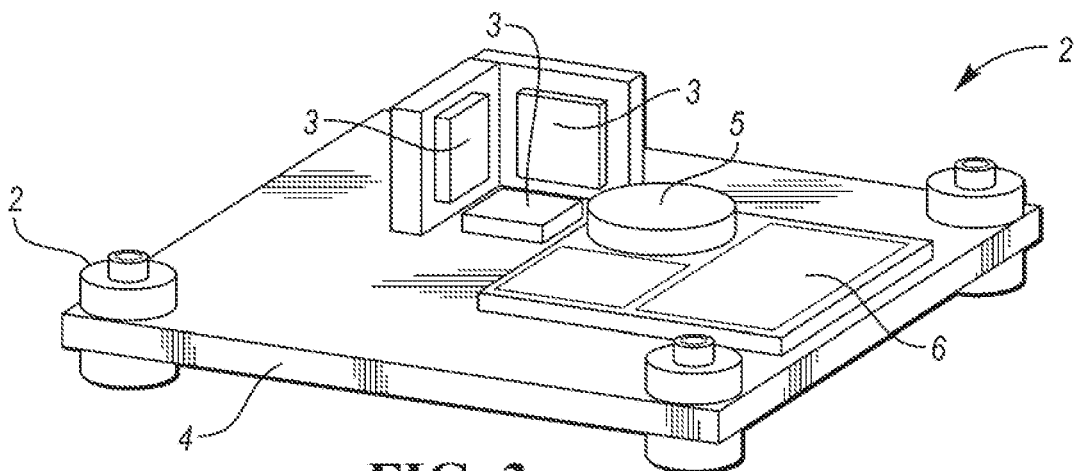
FIG. 3 shows a vibration compensated/passive vibration isolated, according to the prior art.

FIG. 3 shows an example of a vibration compensated/passive vibration isolated system 1 which can be relatively large and expensive because: (1) it requires a relatively large mass (i.e. because of the conventional spring mounts 2 which are relatively stiff (i.e. high k); and (2) it uses three individual single-axis accelerometers 3 (one for each axis) which are mounted orthogonally to the translational axes. In FIG. 3, the system includes one accelerometer 3 for each axis, a vibration isolator 2 at each corner of the system, and extra mass (e.g., a planar sheet 4) in order to achieve resonant frequency. An oscillator package 5 and drive circuit 6 are also disposed on the sheet, and the vibration isolators work to dampen or remove vibration from reaching the accelerometers.

Therefore, a goal of this disclosure is to enable very small size, low cost and low power vibration isolated and/or compensated systems. One implementation includes a very small-size, low-cost, low-power vibration compensated and/or passive vibration isolated oven controlled crystal oscillator (OCXO). To do this, new geometries for assembling passive vibration isolators are being introduced by this disclosure. Also, new methods for acceleration compensation using accelerometers are being introduced. Also, new concepts combining these two approaches are being introduced by this disclosure. The concepts are described mainly for applications involving crystal oscillator devices, but also could be applied to any other sensor, actuator, mechanism, or electronic device that benefits from vibration isolation or acceleration compensation.

Figure 4A:
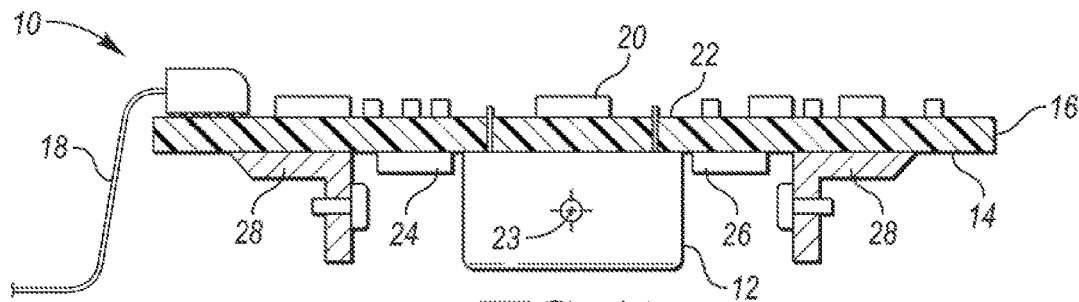
FIG. 4A is a cross-sectional view and FIG. 4B is a bottom view of part of a system for vibration isolation and acceleration compensation of a device, according to one embodiment.
Figure 4B:
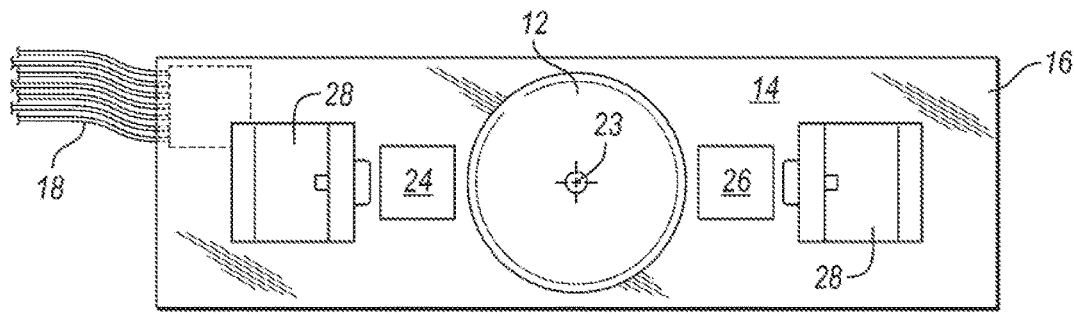

Referring to FIGS. 4A and 4B, an assembly 10 being isolated as part of an isolation system is illustrated prior to mounting the assembly on vibration isolators explained below. The system may include a package (e.g., crystal) which houses a vibration-sensitive oscillator or sensor, herein after referred to as simply a "device." The device may be one or more of a temperature sensor, a strain sensor, an accelerometer, an inertial sensor, a magnetic field sensor, a pressure transducing device such as piezoelectric or capacitive MEMS pressure sensor, quartz crystals for timing references such as crystal oscillators or for bulk-acoustic wave (BAW) or surface-acoustic wave (SAW) sensors, MEMS resonators for timing references, integrated circuits such as analog or mixed-signal ASICs, or an optical sensing or actuating device such as a CMOS image sensor, charge-coupled device, bolometer or other optical detector for light in the visible spectrum or invisible spectra an integrated circuit. The package is connected to an underside 14 of a platform 16 such as a printed circuit board (PCB), and may extend entirely therethrough to reach electrical connections. The PCB also supports various sensors and electronics on the upper side thereof, including other circuit components used for running or compensating the performance of the device. Flexible cables 18 supply electrical power to the device and interconnect various electronic components shown in the system. In this embodiment, three accelerometers are shown, including a first accelerometer 20 on the upper side 22 of the PCB and aligned with the center of mass 23 of the assembly being isolated (e.g., the components illustrated in FIG. 4A-4B), and a second accelerometer 24 and a third accelerometer 26 on the bottom side of the PCB on either lateral side of the package and horizontally aligned with the center of mass. Each of these accelerometers could be a three-axis accelerometer, sensing motion in X, Y, and Z directions. Mounting brackets 28 are also provided on the underside of the PCB, which mount to isolators which are described further below. As mentioned, a "center of mass" is illustrated which is the center of mass of the assembly of the components shown in FIGS. 4A-4B. In other words, the center of mass is the center of mass of the components downstream of the isolators (not shown) that receive vibration or movement after it translates through the isolators.

Figure 5:
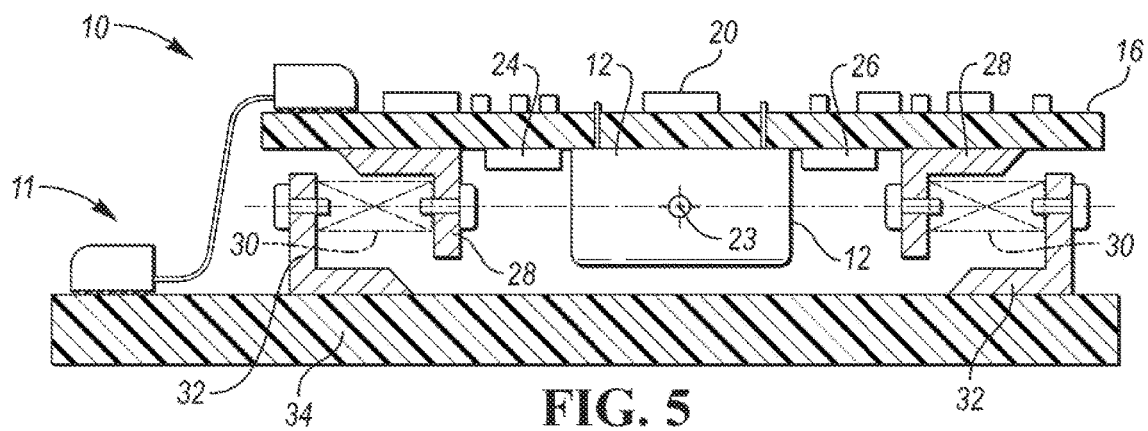
FIG. 5 is a cross-sectional view of the part of the system of FIG. 4A now part of a system for vibration isolation and acceleration compensation of a device, according to a first embodiment.

Referring to FIG. 5, the assembly 10 is now part of a vibration isolation system 11 according to a first embodiment. Each mounting bracket 28 on the underside of the PCB is connected to a vibration isolator 30 (e.g., a spring). Each isolator is connected to a corresponding mounting bracket 32 that is grounded or connected to an external surface or component 34 which vibrations may derive from. In this embodiment, two isolators are shown, oriented horizontally such that their primary axes intersect the center of mass of the assembly being isolated. Placing the isolators in this orientation allows the springs to flex in and out with the side-to-side movement of the center of mass of the assembly being isolated. In the case of rotation, outputs from the two accelerometers on the underside of the PCB can be averaged to cancel out the rotation and measure only the translation acceleration experienced by the device package.

Figure 6:
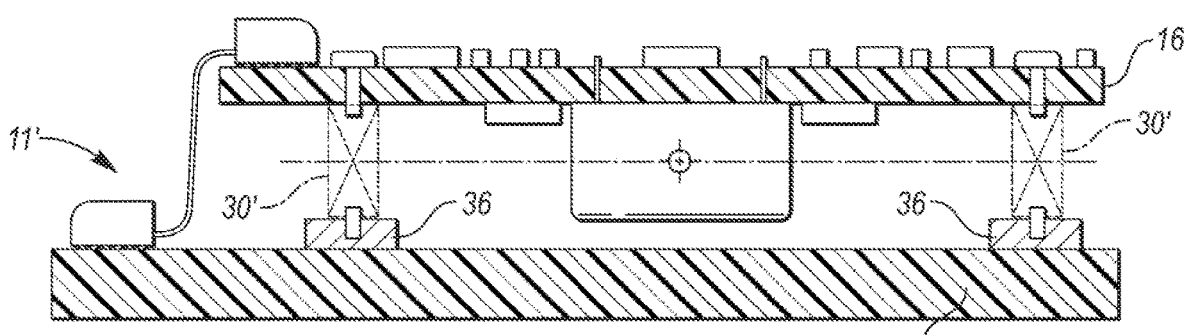
FIG. 6 is a cross-sectional view of a system for vibration isolation and acceleration compensation of a device, according to a second embodiment.

Referring to FIG. 6, a second embodiment of the vibration isolation system 11' is shown in which the vibration isolators 30' are oriented vertically between the PCB 16 and the underlying surface 34. The isolators 30' are each connected to a respective base 36 or spacer that is fixed to the underlying surface. The bases can be made taller or shorter to accommodate the height of the package as the package and PCB translate vertically. The bases can be also made taller or shorter such that the center of the isolators align horizontally with the center of mass of the assembly being isolated.

Figure 7A:
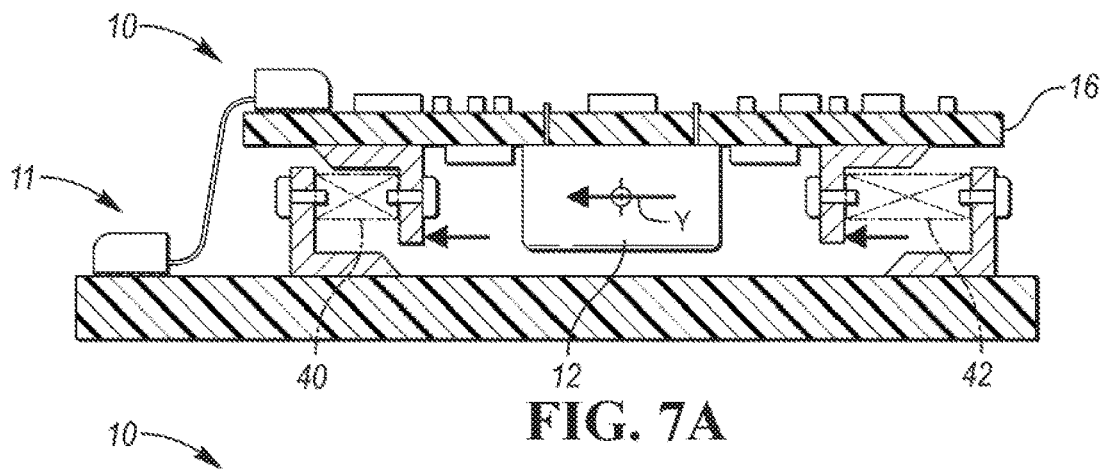
FIG. 7A illustrates Y-axis translation of the system of the first embodiment.
Figure 7B:
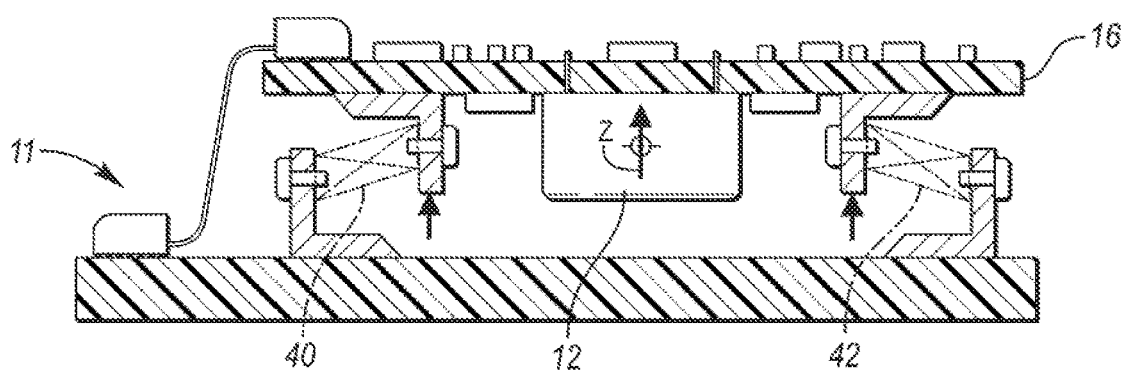
FIG. 7B illustrates Z-axis translation of the system of the first embodiment.

Referring to FIGS. 7A and 7B, Y-axis translation of the isolation system of the first embodiment is illustrated in FIG. 7A and Z-axis translation is illustrated in FIG. 7B. The vibration isolation system is equipped to dampen or isolate vibration translating in either direction. For example, in FIG. 7A, to isolate vibration in the Y-axis, one of the isolators 40 compresses in compression while the other isolator 42 stretches in tension. The package 12 and PCB 16 can translate back and forth in the Y-axis direction, and the isolators can alternate such that one is in compression and the other is in tension, and then the isolator that was in compression is in tension while the other transitions from tension to compression. In FIG. 7B, the isolators 40, 42 can stretch in shear mode to accommodate vibrations causing movement of the package 12 and PCB 16 in the Z-axis direction. Both isolators can move together. To accommodate vibrations in the X-axis (the direction coming out of the view shown), the isolators can bend in shear similar to FIG. 7B.

Figure 8A:
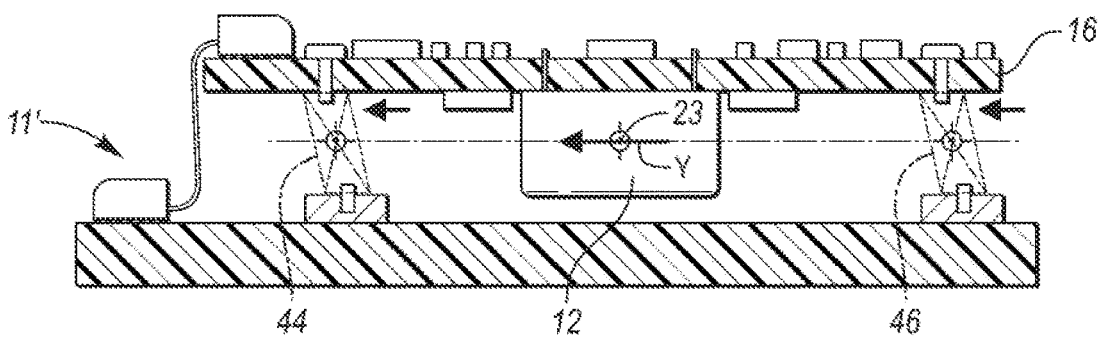
FIG. 8A illustrates Y-axis translation of the system of the second embodiment.
Figure 8B:
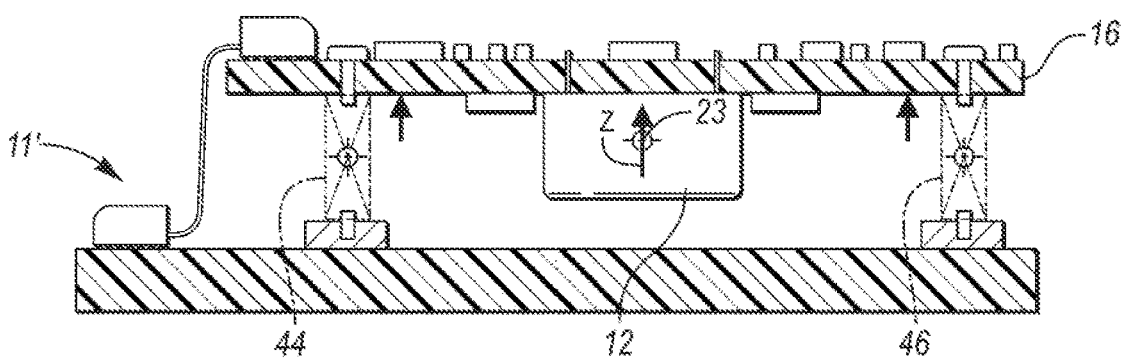
FIG. 8B illustrates Z-axis translation of the system of the second embodiment.

Referring to FIGS. 8A and 8B, Y-axis translation of the isolation system 11' of the second embodiment is illustrated in FIG. 8A, and Z-axis translation is illustrated in FIG. 8B. The centers of the vertically-oriented isolators 44, 46 are horizontally aligned with the center of mass 23 of the assembly being isolated. In FIG. 8A, the isolators 44, 46 can bend in shear to accommodate movement in the Y-axis direction. In FIG. 8B, the isolators 44, 46 can move together in compression and tension to accommodate movement of the package along the Z-axis direction. This removes alignment between the centers of the isolators 44, 46 and the center of mass 23 as the isolators stretch and compress. To accommodate vibrations in the X-axis (the direction coming out of the view shown), the isolators can bend in shear similar to FIG. 8A.

Figure 9:
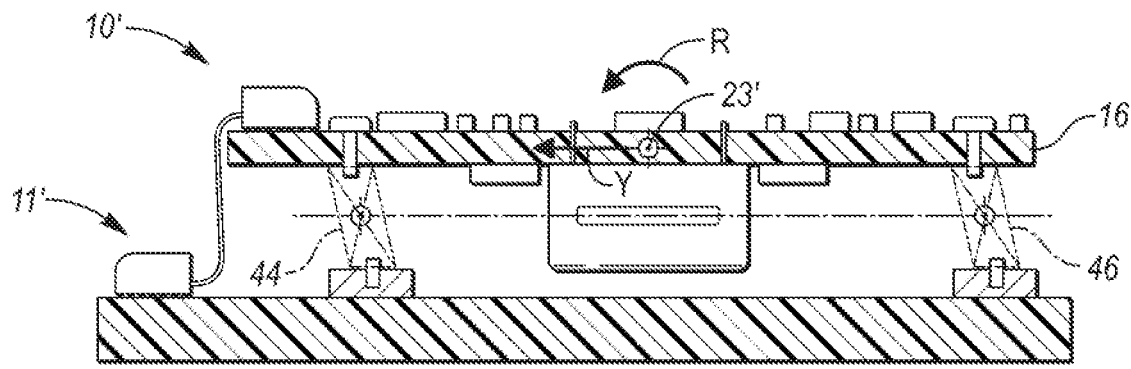
FIG. 9 illustrates the system of the second embodiment in which the center of mass of the assembly being isolated is not aligned with the center of the isolators.

Referring to FIG. 9, the second embodiment of the vibration isolation system 11' is shown where the center of mass 23' of the assembly 10' being isolated is not aligned with the center of the isolators. As a result, when the assembly being isolated is moving in the Y-axis direction (e.g., to the left shown in FIG. 9), the assembly will want to rotate counterclockwise. This may be unintentional and undesirable, as opposed to aligning the center of the isolators horizontally with the center of mass of the assembly being isolated.

Figure 10A:
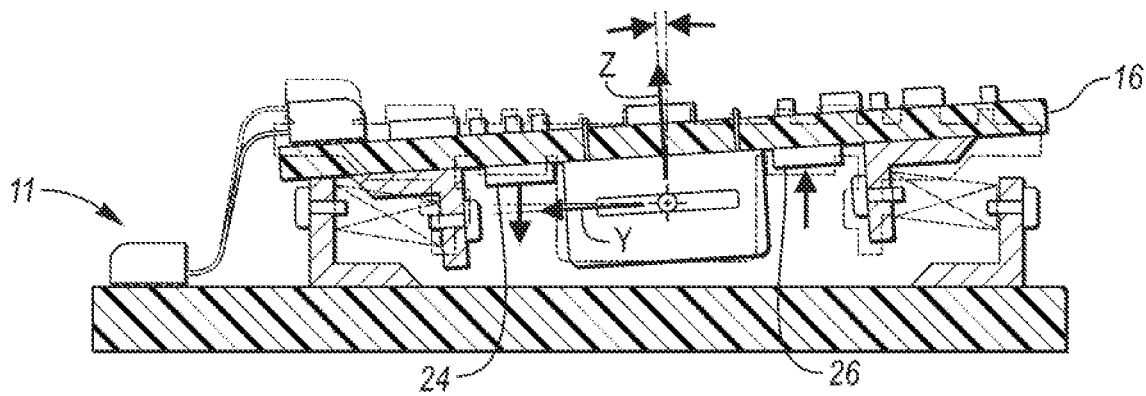
FIG. 10A illustrates a cross-sectional view and FIG. 10B illustrates a bottom view of a spinning or rocking mode of vibration provided to the system of the first embodiment.
Figure 10B:
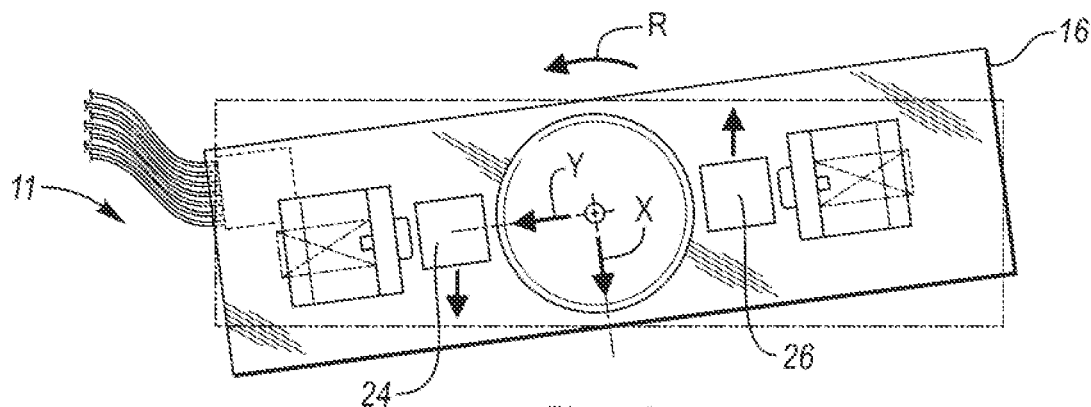

Referring to FIGS. 10A and 10B, an illustration of a spinning or rocking mode of vibration is provided to the vibration isolation system 10 of the first embodiment. This also illustrates how the two accelerometers 24, 26 on the underside of the PCB 16 can be used to cancel out a rocking or spinning mode of vibration. In FIG. 10A, the accelerometer 24 on the left measures a Z-axis acceleration going down while the accelerometer 26 on the right measures a Z-axis acceleration going up, which average out to a zero translational movement of the assembly being isolated. In FIG. 10B, the accelerometer 24 on the left measures an X-axis acceleration going down and the accelerometer 26 on the right measures an X-axis acceleration going up, which average out to a zero translational movement of the assembly being isolated. Similarly, the accelerometers can be positioned so that y-axis rotation can be cancelled out.

Figure 11A:
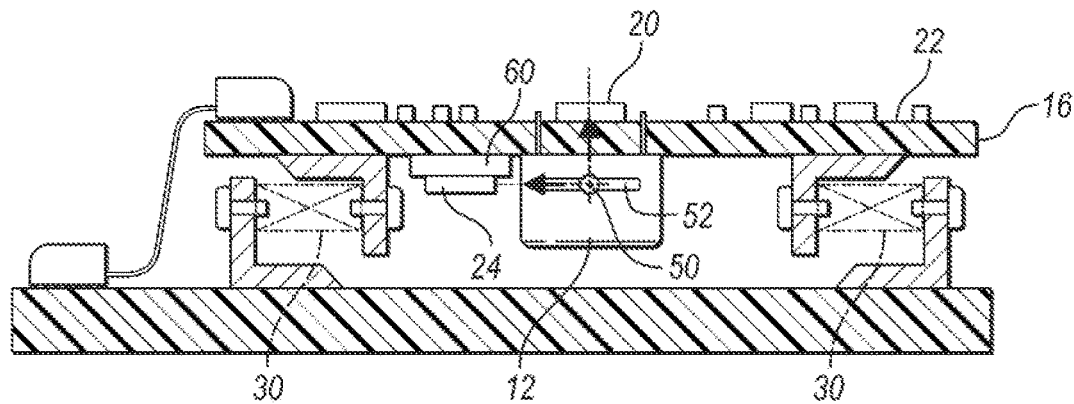
FIG. 11A illustrates a cross-sectional view and FIG. 11B illustrates a bottom view of an embodiment of positioning accelerometers to align with each axis of translation for the device in order to better track the position of the device in the case of rocking or spinning modes of vibration, according to an embodiment.
Figure 11B:
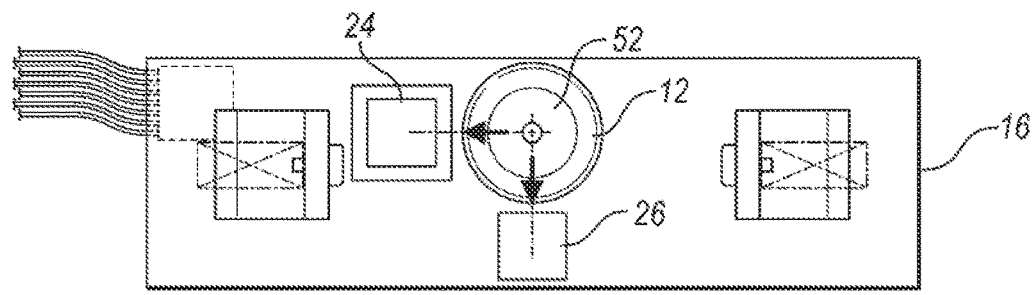

FIGS. 11A and 11B illustrate one embodiment of how to position the accelerometers so that they align with each axis of translation for the device in order to better track the position of the device in the case of rocking or spinning modes of vibration. The accelerometer 20 on the upper side 22 of the PCB 16 is vertically aligned with the center of mass 50 of the device 52 contained within the package 12. The accelerometers 24, 26 on the underside of the PCB are aligned with the center of mass of the device contained within the package, with one accelerometer 24 aligned with the center of mass of the device in the X-direction, and the other accelerometer 26 aligned with the center of mass of the device in the Y-direction. Spacers 60 may be provided between the PCB 16 and the accelerometers to properly align the accelerometers with the center of mass of the device.

Figure 12A:
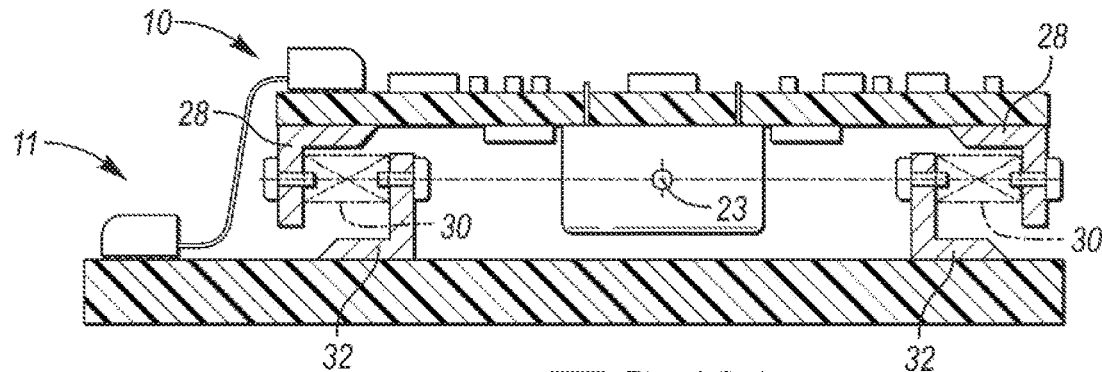
FIG. 12A illustrates a cross-sectional view and FIG. 12B illustrates a bottom view of another embodiment of the system in which the isolators and mounts are anchored to the system as far from the center of mass of the assembly being isolated as possible, according to an embodiment.
Figure 12B:
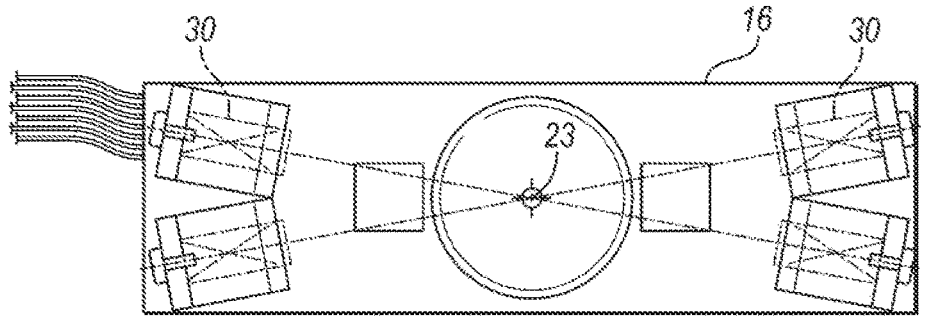

FIGS. 12A and 12B illustrate another embodiment in which the isolators 30 and mounts 28, 32 are anchored to the isolated system as far from the center of mass of the assembly 10 being isolated as possible. The isolators 30 are also angled such that the centerlines of the springs pass through the center of mass to reduce extra vibration modes while not increasing the total volume of the assembly. Four isolators are provided in this embodiment, but more or less can be provided.

Figure 13A:
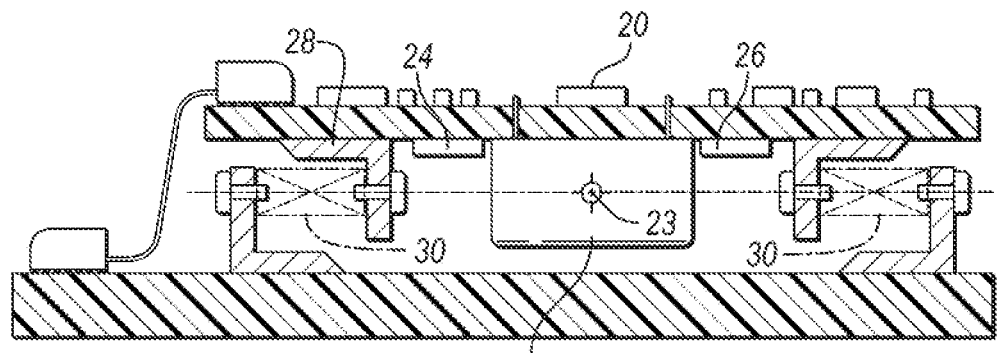
FIG. 13A illustrates a cross-sectional view and 13B illustrates a bottom view of another embodiment of the system with four isolators configured to minimize any rotation modes so that the accelerometers can better track the movement of the assembly and device being isolated, according to an embodiment.
Figure 13B:
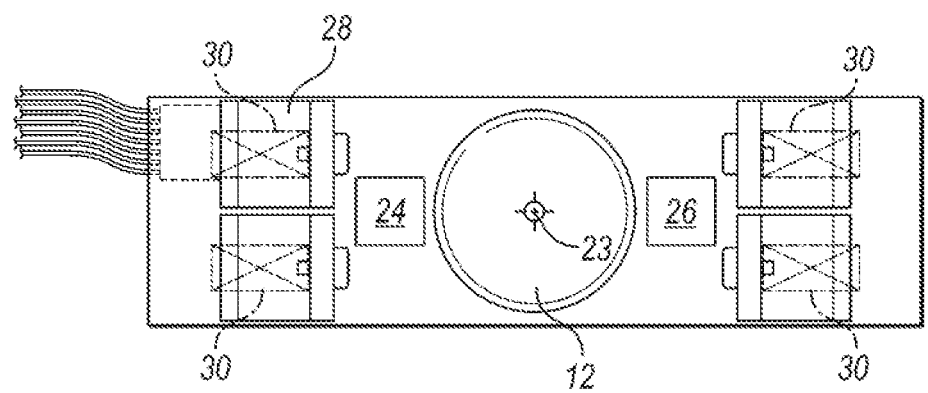

FIGS. 13A and 13B illustrate another embodiment using three or more isolators 30 (four are shown here) to minimize any rotation modes so that the accelerometers can better track the movement of the assembly and device being isolated. The brackets connecting the isolators to the underlying surface are again removed for clarity.

Figure 14A:
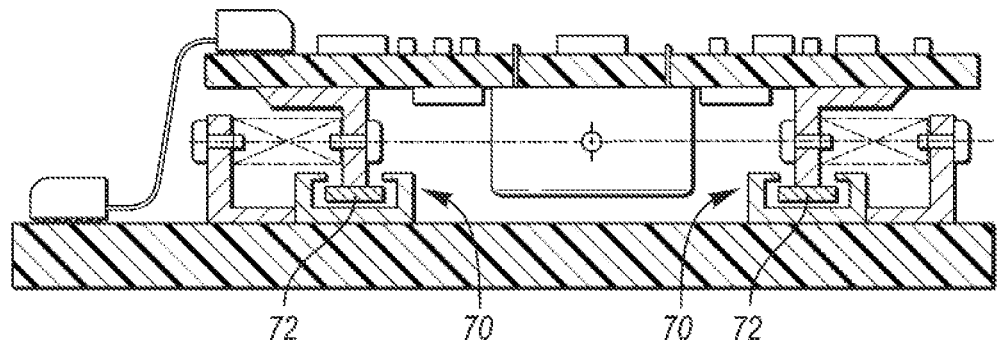
FIG. 14A illustrates a cross-sectional view and 14B illustrates a top view of another embodiment of the system now having shock stops, according to an embodiment.
Figure 14B:
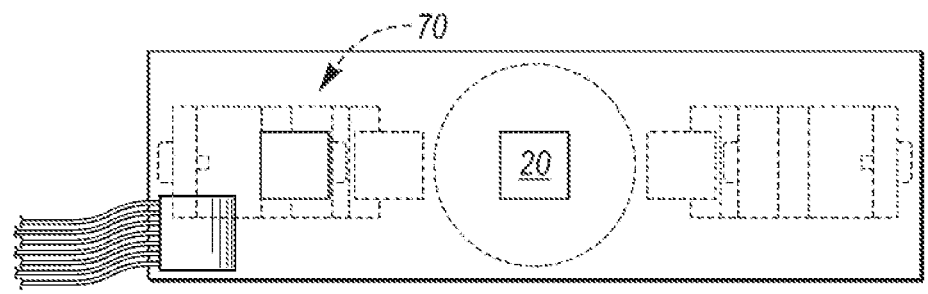

FIGS. 14A and 14B illustrate another embodiment with shock stops 70. Shock stops can be provided to limit the movement of the brackets that connect the isolators to the PCB. The shock stops can be mounted to the underlying surface which may be fixed. As vibration from the underlying surface is translated to the assembly being isolated, the shock stops 70 limit movement of the brackets (and therefore the platform 16) by contacting a portion 72 of the bracket 28 that is received within the shock stock 70. The shock stops can be provided in various locations to limit movement in all three directions.

Figure 15:
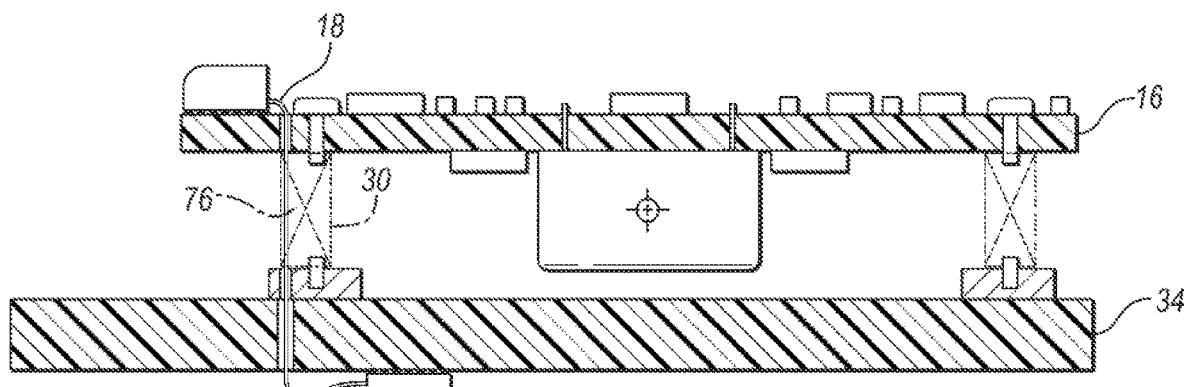
FIG. 15 illustrates a cross-sectional view of another embodiment of the system in which the flexible cables run through the hollow bore of the isolator, according to an embodiment.

FIG. 15 illustrates another embodiment in which the flexible cables 18 run through the hollow bore 76 of one of the isolators 30 to conduct signal and power between the underlying surface 34 and the platform 16 of the system being isolated without extending the footprint. This reduces packaging size of the system. The wires can also extend through a hole in the platform 16 and a hole in the underlying structure 34.

Figure 16:
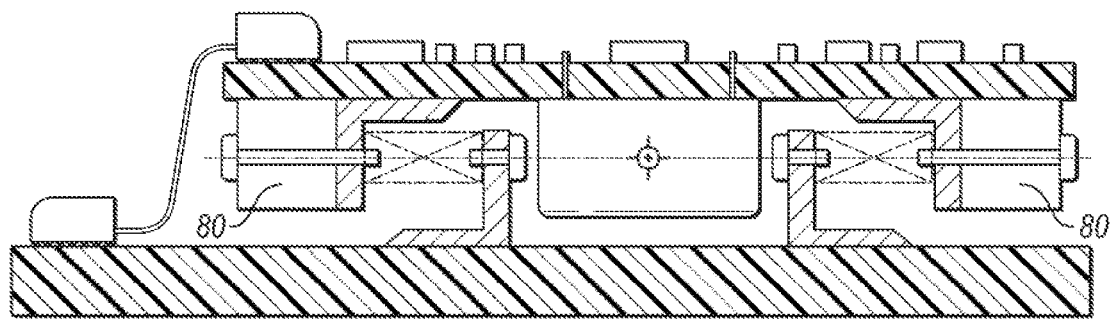
FIG. 16 illustrates an embodiment of the system in which additional supporting platforms are provided.

FIG. 16 illustrates an embodiment in which additional supporting platforms 80 are provided. The additional supporting platforms can be made from a dense material to add mass to reduce the corner frequency of the assembly being isolated.

Figure 17:
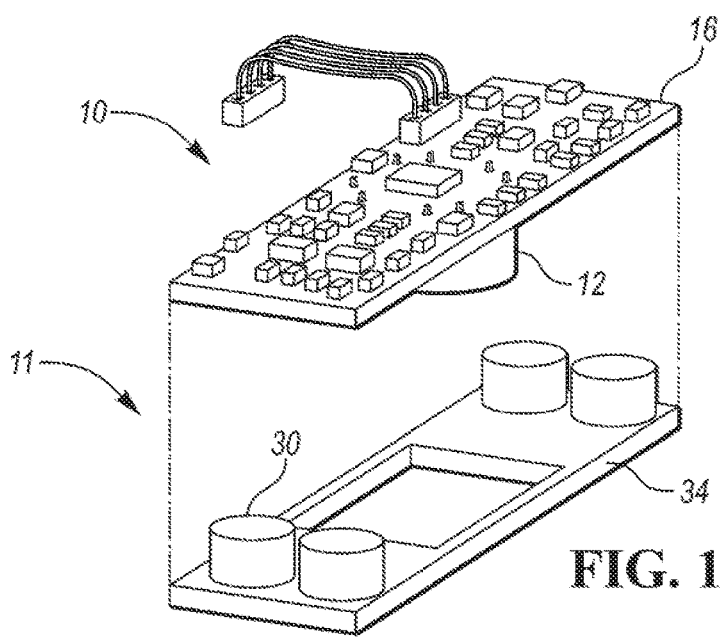
FIG. 17 illustrates an exploded perspective view of the system being isolated above the underlying surfaces from which vibrations can derive, according to one embodiment.

FIG. 17 illustrates an exploded view of one embodiment of the system 11 being isolated above the underlying surfaces from which vibrations can derive. This is a long, narrow implementation of the isolation structure and device assembly. This configuration may be appropriate for integration into a system which needs a vibration isolated device. The final system 11 may be 4.8 cm by 1.4 cm by 1.2 cm, in one example of dimensional profile. The illustrated example contains four isolators shown schematically at 30; however, more or fewer isolators could be used. For example, two isolators could be used, with one isolator centered at each end of the device rather than the pairs of isolators that are illustrated.

Figure 18:
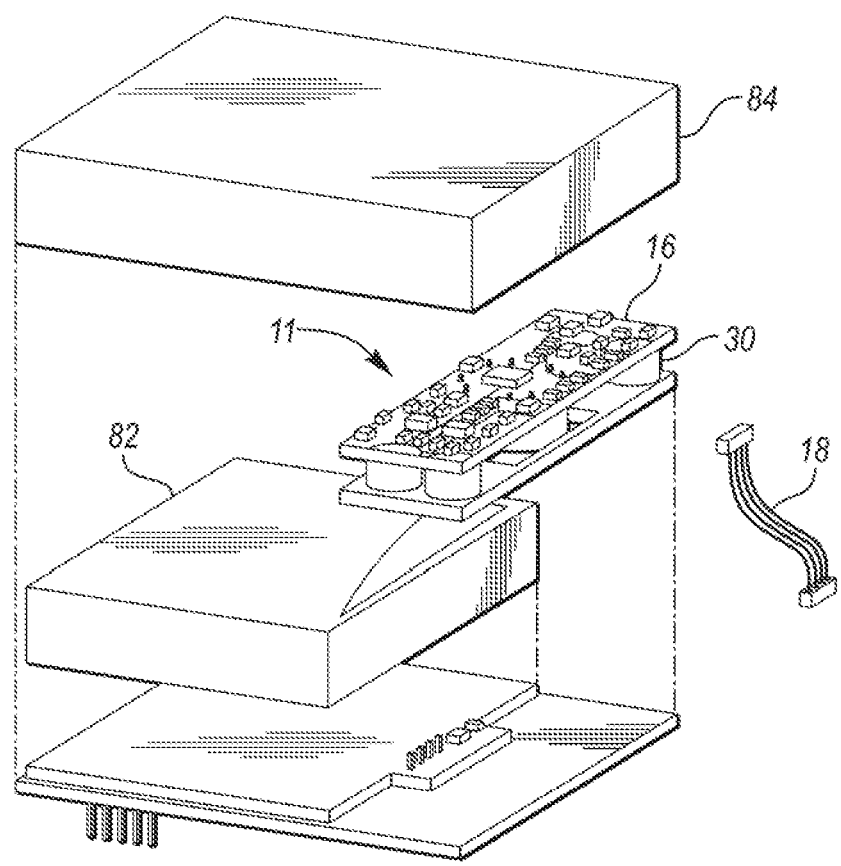
FIG. 18 illustrates an exploded perspective view of the vibration isolated device configured to mount adjacent to another device and fit within a larger housing, according to an embodiment.

FIG. 18 illustrates an exploded view of the vibration isolated system 11 configured to mount adjacent to another device and (optionally) fit within a larger housing. The assembly 10 being isolated may be a vibration-isolated and acceleration-compensated OCXO on an isolation platform 16, similar to the embodiments shown above, adjacent to another device 82 such as a timing reference, another sensor, etc. may be located adjacent and within a common package 84. The timing reference could, for example, be a chip-scale atomic clock or other high-precision timing reference.

Figure 19:
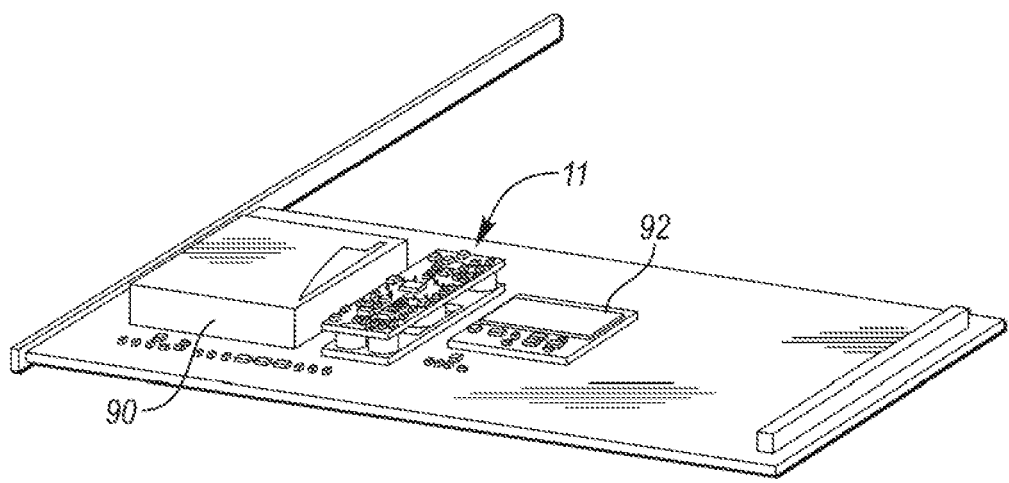
FIG. 19 illustrates a perspective view of a circuit-card level integration of a timing reference or sensor, another electronic module, and a vibration-isolated and acceleration-compensated OCXO, according to one embodiment.

FIG. 19 illustrates a circuit-card level integration of a timing reference or sensor 90, another electronic module 92, and an isolation system 11 such as a vibration-isolated and acceleration-compensated OCXO. An assembled card like this could contain a device (for example a global-positioning system (GPS) receiver and antenna for acquiring a timing signal from an external source).

Referring to FIGS. 4-9, vibration isolation schemes using two (or more) vibration isolators are illustrated whose primary axis intersects the center of mass of the load. As illustrated in FIG. 7 and FIG. 8, with two different spring orientations, the springs shear sideways, compress or stretch together in all three orthogonal axis without any rotation when subject to translational movement. Thus, translational motion can be more accurately quantified and therefore compensated by accelerometer(s) mounted on the system. In contrast, if the center of mass is not aligned with the center of rotation, (see FIG. 9), the system will tend to bend at an angle so that the accelerometer(s) experience different motion than the device being compensated.

The geometry and material properties of the isolation structures maybe designed to attenuate (reduce) accelerations at frequencies higher than a prescribed corner frequency (for example, 200 Hz). The resonance of the structure may be tuned to be less than or equal to 2/3 or the desired corner frequency in order for it to isolate the device from higher frequency vibration (see FIG. 2).

The material of the isolators and mounts can be rubber, an elastomeric material or other plastic, metal, silicon, glass, wood, or any other material. The material may be a material that promotes damping of vibrations to avoid high amplification of vibrations at the resonant frequency of the structure.

The mounting structures are placed on the same side of the board as the tallest components on the system being isolated (in this case the device package) so that the total height of the module can be minimized (see FIG. 5 and FIG. 6).

The mounting structures can also be placed within the area of the board to minimize the footprint of the total system. As illustrated in FIG. 4, the brackets are strategically located to facilitate the location of these isolation mounts.

The isolation mounts can be incorporated into a housing, so that a circuit board can be affixed to the mounts and enclosed in the housing. The housing can be a metal or plastic (or other material) box designed with mechanical connections such as tapped holes to receive connectors affixing the other components within the housing. The housing can incorporate electrical connectors to interface to cables (coaxial cables, wire harnesses, etc. or pins or pads to be installed on printed circuit boards (through-hole or surface mount connections). The housing can also incorporate holes, screws, or other mechanical features to facilitate installing the housing into another system or mounting plate.

The spring constants of the isolation mounts (springs) are chosen so that the desired corner frequency is achieved using only the mass of the necessary components which include: the device package, the circuit board, and the components needed to readout signals and operate the device (see FIG. 6). This mass may also include mounting brackets (see FIG. 5) and/or an additional housing for electromagnetic shielding or other functions.

Two or more springs may be mounted at different angles (other than the orthogonal angles shown in FIG. 4 through FIG. 9) relative to their tensile/compressive spring modes. For example, an advantage could be gained by angling the spring toward the center of mass of the system (for example at a 45° angle with respect to the X, Y, or Z axes if the tensile/compressive vibration mode is different than the shear vibration mode). In this case, if the system moves in any direction, both the tensile/compressive modes and the shear modes are stimulated.

In FIG. 4, FIG. 5, or FIG. 14 using two springs, this system can be rotated by 90 degrees (or some arbitrary angle), along the Y-axis (in-plane to the picture going left right). With 4 or more springs, as in FIG. 13, a special fixed mounting bracket can allow the system to be rotated by 90 degrees (or some arbitrary angle) about the same Y-axis. With the vertical mounts shown in FIG. 6, FIG. 8, and FIG. 9, a fixed mounting bracket could also be implemented where the system could be rotated by 90 degrees (or some arbitrary angle) along the same Y-axis.

A single-package three-axis accelerometer can be used to monitor the motion of the system being isolated. If primarily translation modes of vibration are actuated (as is the intent of this design), this single accelerometer provides accurate measurement, enabling compensation circuitry on the board to perform motion compensation on the device output signal.

In contrast, FIG. 10 shows an example rotational motion with the device at the center of rotation. In this case, each of the accelerometers can sense translational motion, since their positions are offset from the center of rotation. For compensation purposes, this translational motion may be erroneous since the position of the device itself does not translate. Likewise, even if the device does not sit at the center of rotation, rotational motion can result in erroneous compensation since the accelerometers experience a different set of motion vectors than the device itself. A solution disclosed here is to position an accelerometer in-line with each of the device's three orthogonal axes of motion as illustrated in FIG. 11. Each accelerometer could be a three-axis accelerometer, such as one manufactured using microelectromechanical systems (MEMS) technology. Using this technique mitigates the effects of rotation or spinning modes, allowing each accelerometer to more accurately track the movement of the device in the axis it is aligned to—even if the system being isolated is rocking or spinning. This concept can be used with or without passive isolation mounts.

To increase the system's resistance to rotation, instead of using two isolators, the system may include three, four or more isolation mounts as shown in FIG. 13. In this case, the resistance to Z-axis rotation will be limited the most. The orientation of the springs can be as pictured in FIG. 13. Alternatively, they can be positioned vertically as in FIG. 6, or in any other orientation.

Using two or more accelerometers in strategic locations can accurately capture the motion of the crystal even if they are not in-line with the devices translational axis. For example, as shown in FIG. 10, with two accelerometers in-plane with the crystal on either side, the outputs can be averaged together to cancel out signals resulting from rotational motion.

Multiple accelerometers can be combined (for example, using signal averaging) to improve the signal-to-noise ratio of the acceleration detection and, accordingly, improve the acceleration compensation.

The isolation mounts can be anchored to the isolated system as far from the center of mass as possible and angled directly towards the center of mass of the system to reduce extra vibration modes, while not increasing the total volume of the assembly. See FIG. 12.

An accelerometer die can be placed directly within the device package alongside the device being packaged. This would measure the acceleration very close to crystal. Power and I/O for the accelerometer die would use the pins on the device package.

The passive vibration isolator can be removed entirely and a very low noise accelerometer with high bandwidth can be used to enable for high frequency vibration to be compensated. Multiple accelerometers can be used in parallel to improve the high frequency vibration compensation performance.

The crystal package itself could be affixed to a platform or package using flexible mounts to reduce its acceleration sensitivity, especially at high vibration frequencies.

Adding shock stops to the mounting structure can limit the platform excursion and the deflection of the springs when the device is subjected to a mechanical shock, as shown in FIG. 14. This allows the system to move freely (and function as a vibration filter) up to a prescribed acceleration (shock level) which will cause the portions of the assembly being isolated to hit the shock stops, limiting its motion. This can prevent the springs from breaking in the event of large shocks such as dropping the device assembly or launching it on a missile. In the illustration in FIG. 14, part of the mounting bracket on the isolated portion of the assembly is located inside of part of the mounting bracket which is fixed in order to create these shock stops in all 3 axis. Separate structures (i.e. not part of the mounting bracket) could also be specially designed on the isolated portion and fixed portion.

In all implementations, electrical signals from the platform can be carried by individual flexible wires or by a flex cable with connectors or solder connections on either end. The flexible cable can connect to a carrier printed circuit board (card) or directly to a neighboring device.

In all embodiments, the flexible wires or flex cable can be threaded through openings in the board and/or through a hollow bore in the springs themselves.

In all embodiments, instead of using wires for electrical interconnections, a wireless radio frequency or optical connection could be established to connect to the circuits on the isolated system.

In all embodiments, instead of using a square or for the isolated system, a circular or oval geometry may be used.

The embodiments shown in FIG. 4 through FIG. 14 can be used with a package different from a metal can package, such as a leadless chip carrier (LCC) or other ceramic or plastic package. This could result in a lower-profile stack that could fit within a smaller enclosure.

The embodiments shown in FIG. 4 through FIG. 14 show part of the circuit board machined out to create space for the isolation mount (and potentially the isolation brackets) in order to enable better positioning of the isolation mounts to reduce extra vibration modes. The fixed brackets and the brackets on the isolated system can be adjusted to enable this confirmation.

The embodiments shown in FIG. 4 through FIG. 14 can include added weights on the top bottom, front, back, or either side in order to change the center of gravity to be substantially in the plane of the centers of gravity of the springs to enable less vibration modes. These weights can be mounted using an adjustable screw or other mechanism to allow their position to be tuned in order to precisely locate the center of mass for best stability.

An embodiment (such as that illustrated in FIG. 16) can include the board with the device being mounted on a platform that is intentionally weighted to reduce the corner frequency of the system. The platform itself can be made from a dense material (for example, brass, nickel, steel) or a properly weighted frame can be added to the platform to accomplish the mass increase. The geometry of the weight can be adjusted to place the center of mass even with the center of the springs to best stabilize the platform.

The embodiments illustrated in FIG. 4 through FIG. 14 show that the device's most sensitive single axis or two axes are aligned with one accelerometer or with the two accelerometers used to compensate for those axes. For example, some quartz crystal oscillators are more sensitive in the in-plane axis. Two accelerometers could therefore be aligned to two orthogonal in-plane axes (as shown in FIG. 11 but eliminating the backside accelerometer). In another example, the device can be tested ahead of time and find a single in-plane axis which has a relatively high vibration sensitivity. That axis can then be aligned to a single accelerometer. This will save space, reduce the cost of calibration and may improve performance.

The device being isolated can be a crystal oscillator, an inertial sensor (accelerometer, gyroscope), an inertial measurement unit, a magnetometer, infrared sensor or image sensors or other optical devices. It can also be multiple sensors of different types on a single chip or multiple chips with the readout circuitry either integrated on the same chip on a different chip or in a different package. The device can be any acceleration or vibration sensitive device or circuit with or without the electronics needed to run it.

The electronic functions (such as acceleration compensation and oscillator functions) can be accomplished by an integrated circuit rather than board level electronics. In this case, the circuitry would be more compact, and shrink the total systems size. In the most extreme case, all of the electronics and the accelerometer used for compensation can all be integrated into the same package as the device, and they all sit on two or more isolators.

In order to shrink the system's size, the device package or the package and electronics can be mounted on a single isolator (instead of two or more isolators). In the most extreme case, all the electronics and the accelerometer used for compensation can be integrated into the same package as the device, and they all would sit on one isolator.

The aspects of assembling and preparing an acceleration compensated oven-controlled crystal oscillator which involve manual tuning or adjustment of component values could instead be accomplished by electronics. For example, if a correct value of capacitor is typically installed based on tests of the partly assembled device, an array of capacitors could be electronically addressed to select the correct capacitor without manually installing or removing components. Or, if the acceleration compensation tuning relies on a resistor, a digitally controlled potentiometer could be used to adjust the gain of the compensation parameters.

The acceleration compensation tuning approach can include a digital system to do this tuning. For example, a digital accelerometer can be used for measuring the vibration, and a microcontroller or FPGA mounted on the circuit board on the isolated system can be used to readout that digital accelerometer. When being calibrated, the accelerometer acceleration can be measured at the same time as measuring the device output under different vibration and acceleration levels. An algorithm in the microcontroller or FPGA can then switch different capacitors in a capacitor bank (also on the circuit board) or different values of a ditial potentiometer or variable resistor into the circuit until the effects of vibration are mitigated. The measured acceleration vs. the compensation parameters can then be stored in the microcontroller or FPGA.

The aspects of controlling the temperature of an oven-controlled crystal oscillator (OCXO) which are normally accomplished with discrete analog electronics can be accomplished by a digital, analog, or mixed-signal integrated circuit (IC) that would receive temperature data from a temperature sensor as near as possible to the crystal or from a temperature sensor on the IC itself (if located in the oven) and adjust the power driving the oven heater. The power could be adjusted through pulse-width modulation, a digital-to-analog converter, or an analog voltage level. The heat could be applied using a resistive heater on an isolation platform, a power-dissipating circuit mounted on the platform (such as a power transistor), or by structures on the IC itself (if the IC is located close to the crystal).

In all embodiments, the brackets, isolation mounts (springs) and system being isolated can comprise a vibration isolated and/or acceleration compensated oven-controlled crystal oscillator (OCXO). This OCXO can have excellent short-term stability, excellent phase noise and excellent frequency stability even in the presence of vibration.

In all embodiments, the dimensions of the brackets, isolation mounts (springs) and the isolation module could be optimized to fit within a long, narrow space to be conveniently integrated with other devices on a board. The dimensions may be chosen to fit within the enclosure of another device or adjacent to other devices in a compact configuration on a circuit card. See FIG. 17.

The isolation module and another device (such as a timing reference or sensor) can be mounted side by side on circuit card or together in a housing. See FIGS. 18-19. In one embodiment, the vibration-isolated device together with other devices can be mounted together on a single circuit card designed to interface to a standard electronics rack. To further save space, the module can also be mounted directly within the housing of an enclosure next to another device. If mounted to a circuit card, a hole can be machined in the circuit card similar to the hole shown in the floor of the housing platform in FIG. 17 (left), so that the isolated system has room to move, while allowing its total height to be lower.

The vibration isolation system described herein can be incorporated or implemented into or together with a thermal isolation platform disclosed in U.S. Pat. Nos. 8,049,326 and 8,698,292, along with U.S. patent application Ser. No. 14/251,972, the disclosures of which are hereby incorporated by reference herein.

It should be understood that the embodiments described above can be combined to form new embodiments. For example, isolators in various positions from one embodiment can be combined with isolators in other positions disclosed.

The invention claimed is:

1. A system for vibration isolation and acceleration compensation of a device, the system comprising:
    an assembly having a center of mass, the assembly including:
        a printed circuit board (PCB) having an upper side and an underside,
        a package housing a vibration-sensitive device, the package mounted to the underside of the PCB, and
        one or more accelerometers mounted to the PCB outside of the package, the one or more accelerometers configured to detect acceleration of the PCB in at least one of an X-axis direction, a Y-axis direction, and a Z-axis direction; and
    an isolator coupled to the assembly and configured to isolate or dampen vibrations that would otherwise transfer to the assembly from an underlying component to which the assembly is configured to attach, wherein the isolator is configured to stretch or compress along a horizontal axis of the isolator that is parallel to the PCB and intersects the center of mass of the assembly when isolating or dampening the vibrations from the underlying component.

2. The system of claim 1, wherein the isolators are located between the assembly and the underlying component within confines of an exterior perimeter of the PCB, and wherein the isolators are coupled to the same side of the PCB as the center of mass of the assembly.

3. The system of claim 1, wherein each of the isolators defines a center point, and the assembly includes a center of mass that is horizontally aligned with the center points.

4. The system of claim 1, wherein the one or more accelerometers includes a single three-axis accelerometer configured to detect acceleration of the PCB in the X-axis direction, the Y-axis direction, and the Z-axis direction.

5. The system of claim 1, further comprising a first bracket connecting the isolator to the PCB, and a second bracket configured to connect the isolator to the underlying component.

6. The system of claim 5, wherein the isolator is connected to the first bracket and to the second bracket at locations along the horizontal axis.

7. A system for vibration isolation and acceleration compensation of a device, the system comprising:
    an assembly having a center of mass, the assembly including:
        a printed circuit board (PCB) having an upper side and an underside,
        a package housing a vibration-sensitive device, the package mounted to the underside of the PCB, and
        one or more accelerometers mounted to the PCB outside of the package, the one or more accelerometers configured to detect acceleration of the PCB in an X-axis direction, a Y-axis direction, and a Z-axis direction; and
    an isolator coupled to the assembly and configured to isolate or dampen vibrations that would otherwise transfer to the assembly from an underlying component to which the assembly is configured to attach, wherein the isolator is configured to stretch or compress along a vertical axis that is normal to the PCB, and wherein the isolator defines a center point that is horizontally aligned with the center of mass of the assembly when the isolator is not subject to the vibrations.

8. The system of claim 7, wherein the isolator is configured to stretch or compress along a horizontal axis that is parallel to the PCB and intersects the center of mass of the assembly.

9. The system of claim 7, wherein the isolators are located vertically between the assembly and the underlying component within vertical confines of an exterior perimeter of the PCB.

10. The system of claim 7, further comprising a first bracket connecting the isolator to the PCB, and a second bracket configured to connect the isolator to the underlying component.

11. The system of claim 10, wherein the isolator is connected to the first bracket and to the second bracket at locations along the horizontal axis.

* * * * *